(12) United States Patent
Yeh et al.

(10) Patent No.: US 12,094,518 B2
(45) Date of Patent: Sep. 17, 2024

(54) MEMORY DEVICE

(71) Applicant: MACRONIX International Co., Ltd., Hsinchu (TW)

(72) Inventors: Teng-Hao Yeh, Hsinchu County (TW); Hang-Ting Lue, Hsinchu (TW); Chih-Wei Hu, Miaoli County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 176 days.

(21) Appl. No.: 17/988,760

(22) Filed: Nov. 17, 2022

(65) Prior Publication Data

US 2024/0170046 A1  May 23, 2024

(51) Int. Cl.
*G11C 11/40* (2006.01)
*G11C 11/4074* (2006.01)
*G11C 11/408* (2006.01)

(52) U.S. Cl.
CPC ...... *G11C 11/4085* (2013.01); *G11C 11/4074* (2013.01); *G11C 11/4087* (2013.01)

(58) Field of Classification Search
CPC ............ G11C 11/4085; G11C 11/4074; G11C 11/4087
See application file for complete search history.

(56) References Cited

U.S. PATENT DOCUMENTS

| | | | |
|---|---|---|---|
| 6,385,074 B1 | 5/2002 | Johnson et al. | |
| 6,738,307 B2 | 5/2004 | Eaton, Jr. et al. | |
| 7,161,823 B2 | 1/2007 | Lee et al. | |
| 7,564,734 B2 * | 7/2009 | Kumagai | G09G 5/363 |
| | | | 365/189.08 |
| 2004/0027907 A1* | 2/2004 | Ooishi | G11C 11/15 |
| | | | 365/226 |
| 2004/0240259 A1 | 12/2004 | Kajigaya et al. | |

(Continued)

FOREIGN PATENT DOCUMENTS

| | | |
|---|---|---|
| CN | 100552813 | 10/2009 |
| JP | H01262653 | 10/1989 |
| JP | H08195083 | 7/1996 |

(Continued)

OTHER PUBLICATIONS

"Office Action of Taiwan Counterpart Application", issued on Dec. 11, 2023, pp. 1-3.

(Continued)

*Primary Examiner* — Han Yang
(74) *Attorney, Agent, or Firm* — J.C. Patents

(57) ABSTRACT

A memory device, such as three dimension AND Flash memory, including a plurality of word line decoding circuit areas, a plurality of common power rails and a plurality of power drivers is provided. The word line decoding circuit areas are arranged in an array, and form a plurality of isolation areas, wherein each of the isolation areas is disposed between two adjacent word line decoding circuit areas. Each of the common power rails is disposed along the isolation areas. The power drivers respectively correspond to the word line decoding circuit areas. Each of the power drivers is disposed between each of the power driving circuit areas and each of the corresponding isolation areas, wherein each of the power drivers is configured to provide a common power to the word line decoding circuit areas.

14 Claims, 8 Drawing Sheets

(56) References Cited

U.S. PATENT DOCUMENTS

2007/0206399 A1   9/2007   Makino et al.

FOREIGN PATENT DOCUMENTS

| JP | 2003173682 | 6/2003 |
| TW | I286325 | 9/2007 |
| WO | 2019077747 | 4/2019 |

OTHER PUBLICATIONS

"Notice of Allowance of Japan Counterpart Application," issued on Jan. 23, 2024, p. 1-p. 3, in which the listed eferences were cited.
"Office Action of Taiwan Counterpart Application", issued on May 17, 2024, p. 1-p. 4.
"Office Action of Korea Counterpart Application", issued on Apr. 3, 2024, with English translation thereof, pp. 1-11.

* cited by examiner

MEMORY DEVICE

BACKGROUND

Technical Field

The invention relates to a memory device, and particularly relates to a memory device capable of improving efficiency of power supply and signal transmission.

Description of Related Art

In a three-dimensional AND-type memory device, in order to improve an operating speed, a memory cell array may be divided into a plurality of small memory cell blocks. Under such condition, each memory cell block needs a common power and a common signal to provide a power supply and a decoding operation.

In the three-dimensional AND-type memory framework, an auxiliary circuit and a voltage shifter are set in an enclosed area of the memory cell block. Since bit line switches and source line switches are all set above and below each of the memory cell blocks, when laying out common power rails and common signal rails, the common power rails and the common signal rails may conflict with wiring paths of the bit line switches and the source line switches, which increases layout difficulty of the common power rails and the common signal rails.

SUMMARY

The invention is directed to a memory device, which is adapted to reduce layout complexity of common power rails and signal rails.

The invention provides a memory device, such as three dimension AND Flash memory device, including a plurality of word line decoding circuit areas, a plurality of common power rails and a plurality of power drivers. The word line decoding circuit areas are arranged in an array, and form a plurality of isolation areas, wherein each of the isolation areas is disposed between two adjacent word line decoding circuit areas. Each of the common power rails is disposed along the isolation areas. The power drivers respectively correspond to the word line decoding circuit areas. Each of the power drivers is disposed between each of the power driving circuit areas and each of the corresponding isolation areas, wherein each of the power drivers is coupled to each of the corresponding common power rails, and is configured to provide a common power to the word line decoding circuit areas.

Based on the above description, in the memory device of the invention, a plurality of word line decoding circuit areas are arranged into an array, and an isolation area is formed between every two adjacent word line decoding circuit areas. In this way, the common power rails may be set in the above isolation areas, which may reduce a conflict between wiring paths of the common power rails and wirings of other circuits, and reduce layout complexity of the common power rails.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
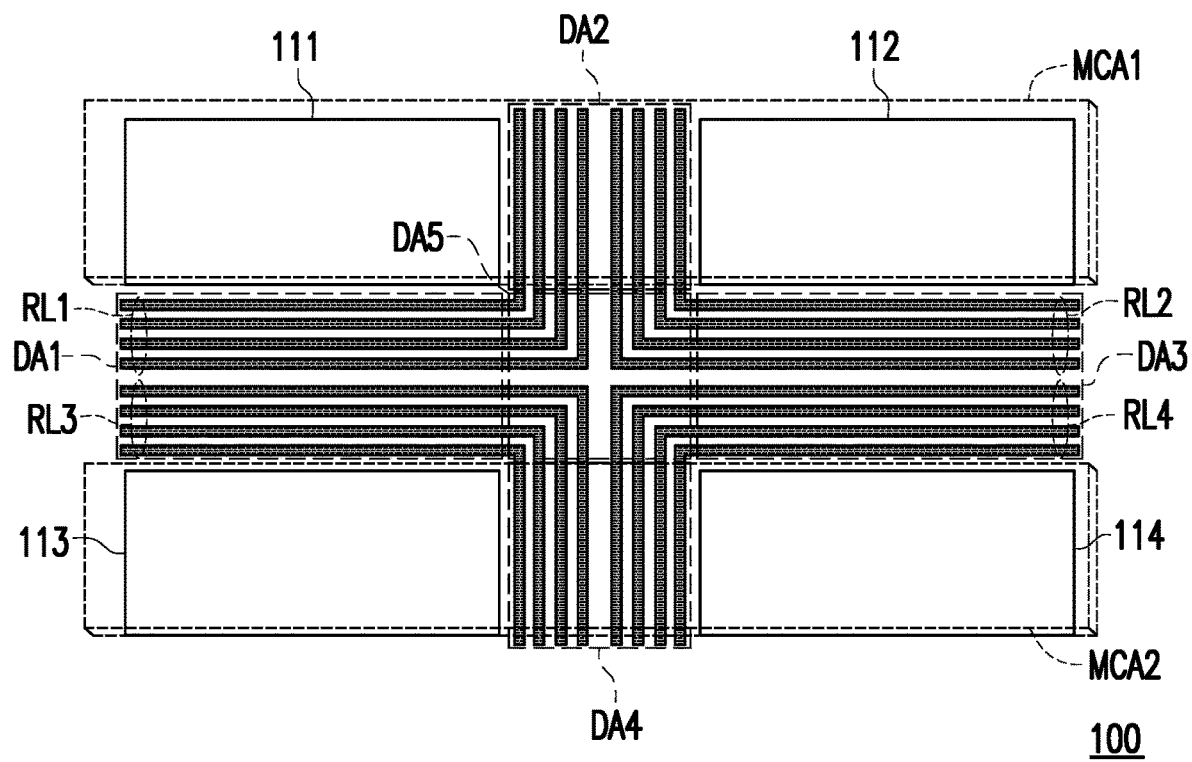
FIG. 1 is a schematic diagram of a memory device according to an embodiment of the invention.

Referring to FIG. 1, FIG. 1 is a schematic diagram of a memory device according to an embodiment of the invention. A memory device 100 includes a plurality of word line decoding circuit areas 111-114, a plurality of rails RL1-RL4, and a plurality of memory cell blocks MCA1-MCA2. In the embodiment, the word line decoding circuit areas 111-114 are set as an array, such as a 2×2 array. The word line decoding circuit areas 111 and 112 are set along a first direction (such as a horizontal direction), and the word line decoding circuit areas 113 and 114 are set along a second direction parallel to the first direction. The word line decoding circuit areas 111-114 form a plurality of isolation areas DA1-DA5, where the isolation area DA1 is formed between the adjacent word line decoding circuit areas 111 and 113; the isolation area DA2 is formed between the adjacent word line decoding circuit areas 111 and 112; the isolation area DA3 is formed between the adjacent word line decoding circuit areas 112 and 114; the isolation area DA4 is formed between the adjacent word line decoding circuit areas 113 and 114; and the isolation area DA5 is formed at a center area of the array.

The rails RL1-RL4 are disposed in the isolation areas DA1-DA5. In the embodiment, the rails RL1-RL4 may be common power rails. In detail, the rail RL1 is arranged along the isolation areas DA1, DA5 and DA2; the rail RL2 is arranged along the isolation areas DA2, DA5 and DA3; the rail RL3 is arranged along the isolation areas DA1, DA5 and DA4; and the rail RL4 may be arranged along the isolation areas DA3, DA5 and DA4. Each of the rails RL1-RL4 may be an L-shaped rail.

When the rails RL1-RL4 are common power rails, each of the rails RL1-RL4 may be used to transmit an operating voltage or a reference ground voltage to at least one of an auxiliary circuit and the power driver in the memory device 100. In other embodiments of the invention, each of the rails RL1-RL4 may also be a common signal rail used for transmitting a common signal to the auxiliary circuit in the memory device 100.

In addition, in the embodiment, the memory device 100 further includes a plurality of power drivers (not shown). The power drivers respectively correspond to the word line decoding circuit areas 111-114, and may be disposed between each of the word line decoding circuit areas 111-

114 and the corresponding isolation areas DA1-DA4. In detail, the power driver corresponding to the word line decoding circuit area 111 may be disposed between the word line decoding circuit area 111 and the isolation area DA1; the power driver corresponding to the word line decoding circuit area 112 may be disposed between the word line decoding circuit area 112 and the isolation area DA3; the power driver corresponding to the word line decoding circuit area 113 may be disposed between the word line decoding circuit area 113 and the isolation area DA1; the power driver corresponding to the word line decoding circuit area 114 may be disposed between the word line decoding circuit area 114 and the space area DA3. In this way, the rails RL1-RL4 serving as the common power rails may transmit the operating power and the reference ground power to the word line decoding circuit areas 111-114.

On the other hand, in the embodiment, the memory cell block MCA1 may be stacked and covered on the word line decoding circuit area 111, the word line decoding circuit area 112, and the isolation area DA2 between the word line decoding circuit area 111 and the word line decoding circuit area 112. The memory cell block MCA2 may be stacked and covered on the word line decoding circuit area 113, the word line decoding circuit area 114, and the isolation area DA4 between the word line decoding circuit area 113 and the word line decoding circuit area 114. In this way, the word line decoding circuit area 111 and the word line decoding circuit area 112 may directly provide a word line signal to the memory cell block MCA1; and the word line decoding circuit area 113 and the word line decoding circuit area 114 may directly provide a word line signal to the memory cell block MCA2.

The memory device 100 of the embodiment is a three-dimensional stacked memory device, and the memory cell blocks MCA1 and MCA2 may be three-dimensional stacked AND-type flash memory cell blocks or NOR-type flash memory cell blocks.

Figure 2:
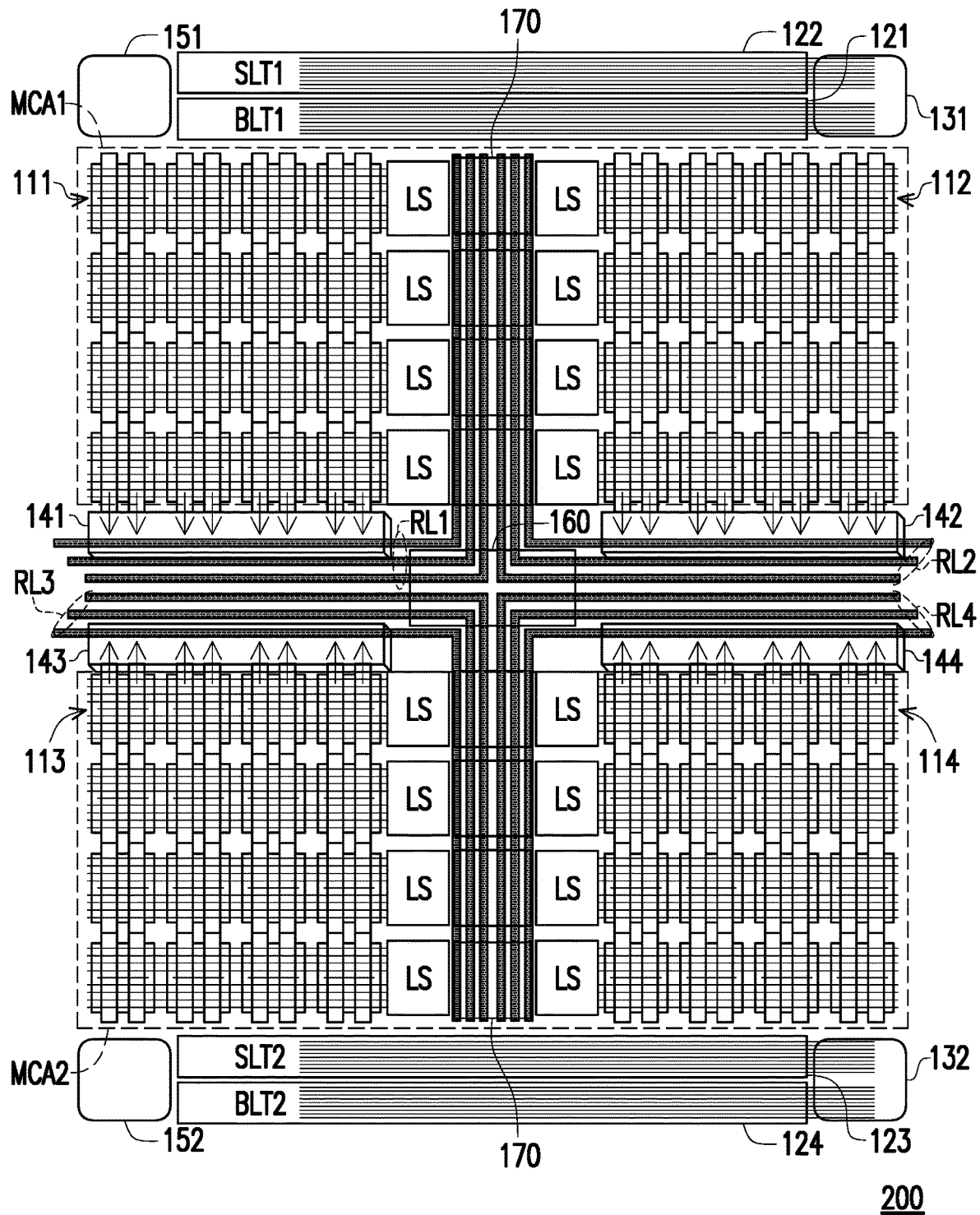
FIG. 2 is a structural top view of a memory device according to another embodiment of the invention.

Referring to FIG. 2, FIG. 2 is a structural top view of a memory device according to another embodiment of the invention. Description is made with reference of the schematic diagram of FIG. 1. The memory device 100 includes the word line decoding circuit areas 111-114, a plurality of rails RL1-RL4, a plurality of memory cell blocks MCA1-MCA2, setting areas 121 and 123 of bit line switches, setting areas 122 and 124 of source line switches, power drivers 141-144, 151 and 152, bit line switch and source line switch drivers 131, 132, a block decoder 160, an auxiliary circuit 170 and a voltage shifter circuit LS.

The word line decoding circuit areas 111-114 are disposed in an array and form a plurality of isolation areas. The power drivers 141-144 are disposed in the array, where the power drivers 141-144 respectively correspond to the word line decoding circuit areas 111-114, and are respectively disposed adjacent to the word line decoding circuit areas 111-114. The rails RL1-RL4 are disposed in a plurality of isolation areas in the array, and related positions thereof are the same as those in the embodiment of FIG. 1, and details thereof are not repeated here.

In the embodiment, the power drivers 141-144 are respectively used to provide an operating power to the word line decoding circuit areas 111-114, and the power drivers 151 and 152 may be used to provide a reference ground power.

In addition, in the embodiment, the setting area 121 of bit line switches and the setting area 122 of source line switches are disposed outside a first side edge (an upper side edge) of the array formed by the word line decoding circuit areas 111-114, and the setting area 123 of bit line switches and the setting area 124 of source line switches are disposed outside a second side edge (a lower side edge) of the array formed by the word line decoding circuit areas 111-114. A plurality of bit line switches BLT1 are disposed in the setting area 121 of bit line switches; a plurality of bit line switches BLT2 are disposed in the setting area 123 of bit line switches; a plurality of source line switches SLT1 are disposed in the setting area 122 of source line switches; and a plurality of source line switches SLT2 are disposed in the setting area 124 of source line switches.

The bit line switch and source line switch driver 131 is disposed adjacent to the setting areas 121 and 122. The bit line switch and source line switch driver 131 controls an o/off state of the bit line switch BLT1 and the source line switch SLT1 to provide a bit line signal and a source line signal to the memory cell block MCA1. On the other hand, the bit line switch and source line switch driver 132 is disposed adjacent to the setting areas 123 and 124. The bit line switch and source line switch driver 132 controls the on/off state of the bit line switch BLT2 and the source line switch SLT2 to provide the bit line signal and the source line signal to the memory cell block MCA2.

It should be noted that in the embodiment, in the array formed by the word line decoding circuit areas 111-114, the block decoder 160, a plurality of auxiliary circuits 170 and a plurality of voltage shifter circuits LS may be disposed in the vertical isolation areas. The block decoder 160 may be disposed in the center of the array, and the auxiliary circuits 170 may be disposed above and below the block decoder 160. Each of the voltage shifter circuits LS may be disposed on a first side or a second side of each corresponding auxiliary circuit 170.

It should be noted that each of the rails RL1-RL4 may be a common power rail or a common signal rail. Each of the rails RL1-RL4 serving as the common power rail may transmit a common power to at least one of the power drivers 141-144, the block decoder 160, the auxiliary circuits 170 and the voltage shifter circuits LS. Each of the rails RL1-RL4 serving as the common signal rail may transmit a common signal to at least one of the power drivers 141-144, the block decoder 160, the auxiliary circuits 170 and the voltage shifter circuits LS.

The common signal may include a decoding result, an enable signal, a pause signal, an output signal of a state register, and a plurality of marking flags. The decoding result is generated by the block decoder 160 to indicate the memory cell block for operation. The enable signal is used to determine whether to activate the block decoder 160. The pause signal is used to determine whether to stop and access operation of the block decoder 160. The state register is used to record a number of times of writing operations of a memory cell, and used to indicate whether the writing operations of the memory cell exceeds a safe value. The marking flags are used to record various abnormal states in the memory device.

In the embodiment, wiring paths of the rails RL1-RL4 do not conflict with wiring paths of the bit line switches BLT1 and BLT2 and the source line switches SLT1 and SLT2. The rails RL1-RL4 may be simply and directly connected to corresponding circuit components, and under the premise that the layout complexity is effectively reduced, a transmission impedance generated by the rails RL1-RL4 may be effectively reduced, thereby improving transmission performance of power and signals.

In the embodiment, circuit structures of the word line decoding circuit areas 111-114, the power drivers 141-144, the bit line switches BLT1 and BLT2, the source line switches SLT1 and SLT2, the power drivers 141-144, 151 and 152, the bit line switch and source line switch drivers 131, 132, the block decoder 160, the auxiliary circuits 170 and the voltage shifter circuits LS may all be implemented by related circuits known to those skilled in the art, which is not limited by the invention.

Figure 3:
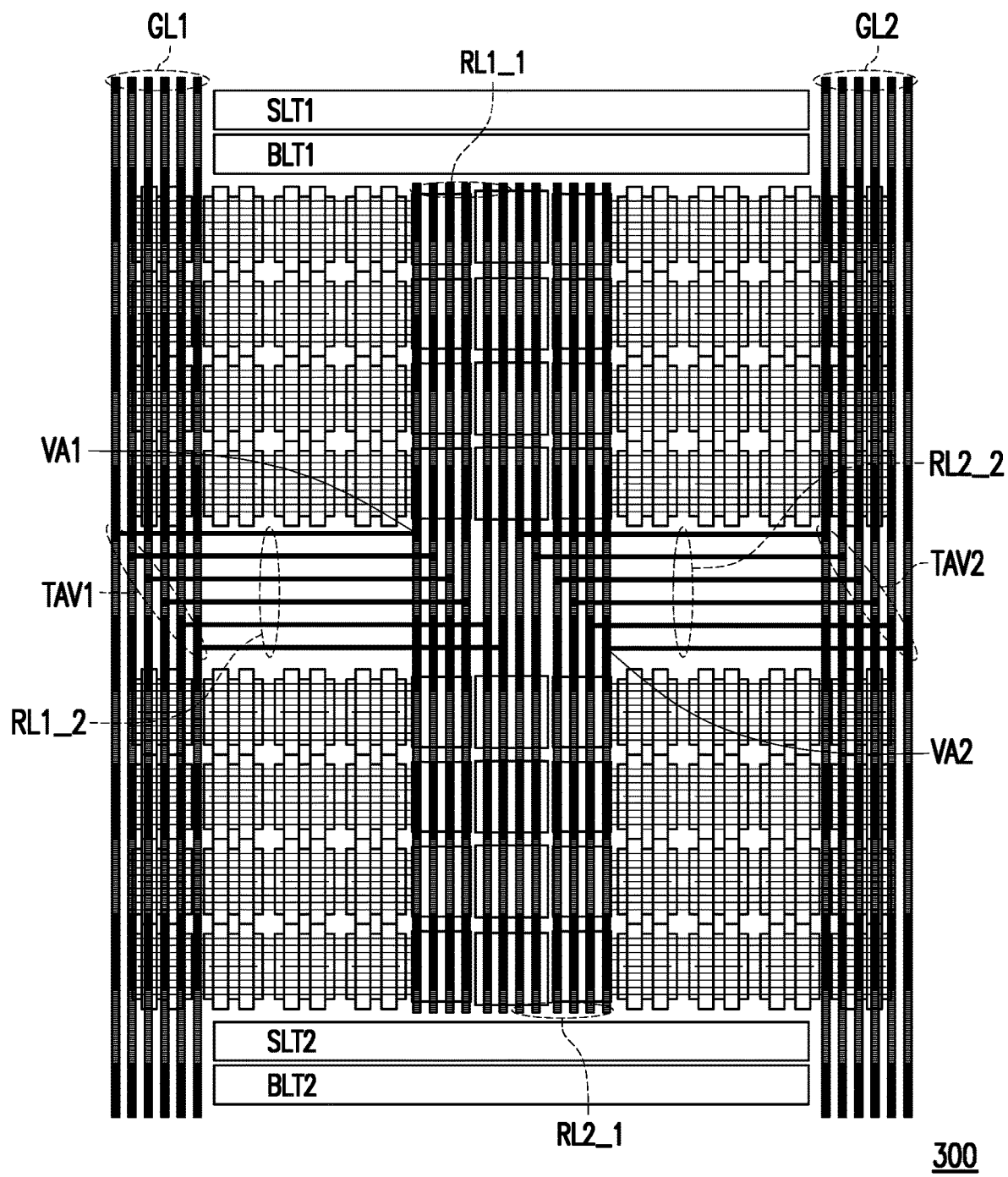
FIG. 3 is a structural schematic diagram of a memory device according to another embodiment of the invention.

Referring to FIG. 3, FIG. 3 is a structural schematic diagram of a memory device according to another embodiment of the invention. The following description may be made with reference of FIG. 2. In FIG. 3, in a memory device 300, first partial rails RL1_1 and RL2_1 disposed in the isolation areas may be formed by a first layer BM1 and a second layer BM2 of a bottom metal layer. A second partial rail RL1_2 may be connected to the first partial rail RL1_1 through a through via VA1; and a second partial rail RL2_2 may be connected to the first partial rail RL2_1 through a through via VA2. The second partial rails RL1_2 and RL2_2 are respectively coupled to transmission array vias TAV1 and TAV2. The second partial rail RL1_2 is coupled to a transmission line GL1 through the transmission array via TAV1, and the second partial rail RL2_2 is coupled to a transmission line GL2 through the transmission array via TAV2. Here, the transmission lines GL1 and GL2 may be common power lines or common signal lines.

In the embodiment, the second partial rails RL1_2 and RL2_2 may be formed by a first layer BM3 and a second layer BM4 of the bottom metal layer, and a first layer TM1 of a top metal layer. The transmission lines GL1 and GL2 may be formed by a second layer TM2 of the top metal layer.

Figure 4:
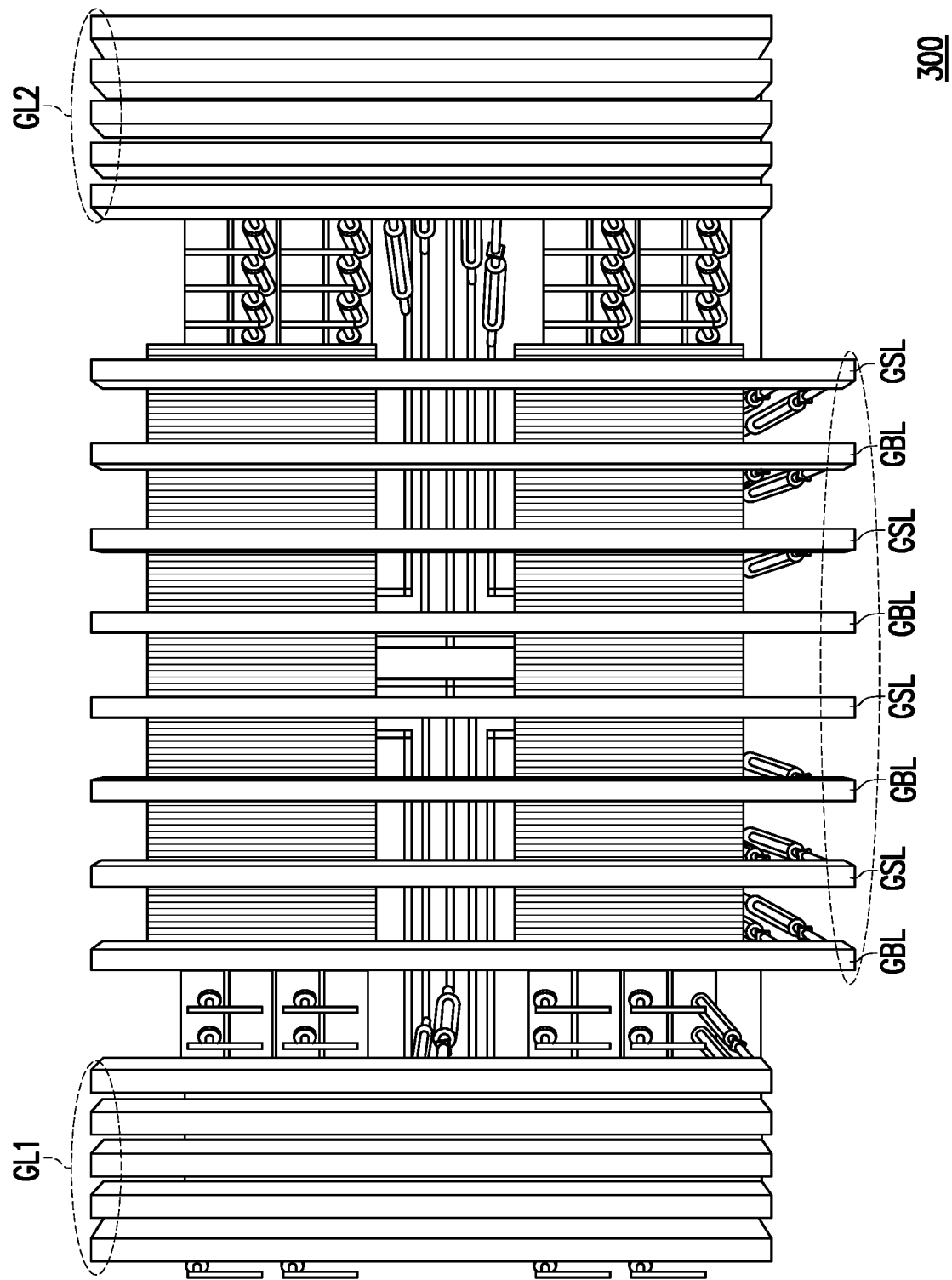
FIG. 4 is a schematic diagram of another implementation of a memory device according to an embodiment of the invention.

Further, referring to FIG. 4, FIG. 4 is a schematic diagram of another implementation of the memory device according to the embodiment of the invention. In FIG. 4, common bit lines GBL and common source lines GSL of the memory device 300 may be formed by a second layer TM2 of the top metal layer and span over the memory cell block. Where, the common bit lines GBL and the common source lines GSL may be arranged in an interleaving manner. The common bit lines of the memory device 300 may have a same height with the transmission lines GL1, GL2.

Figure 5:
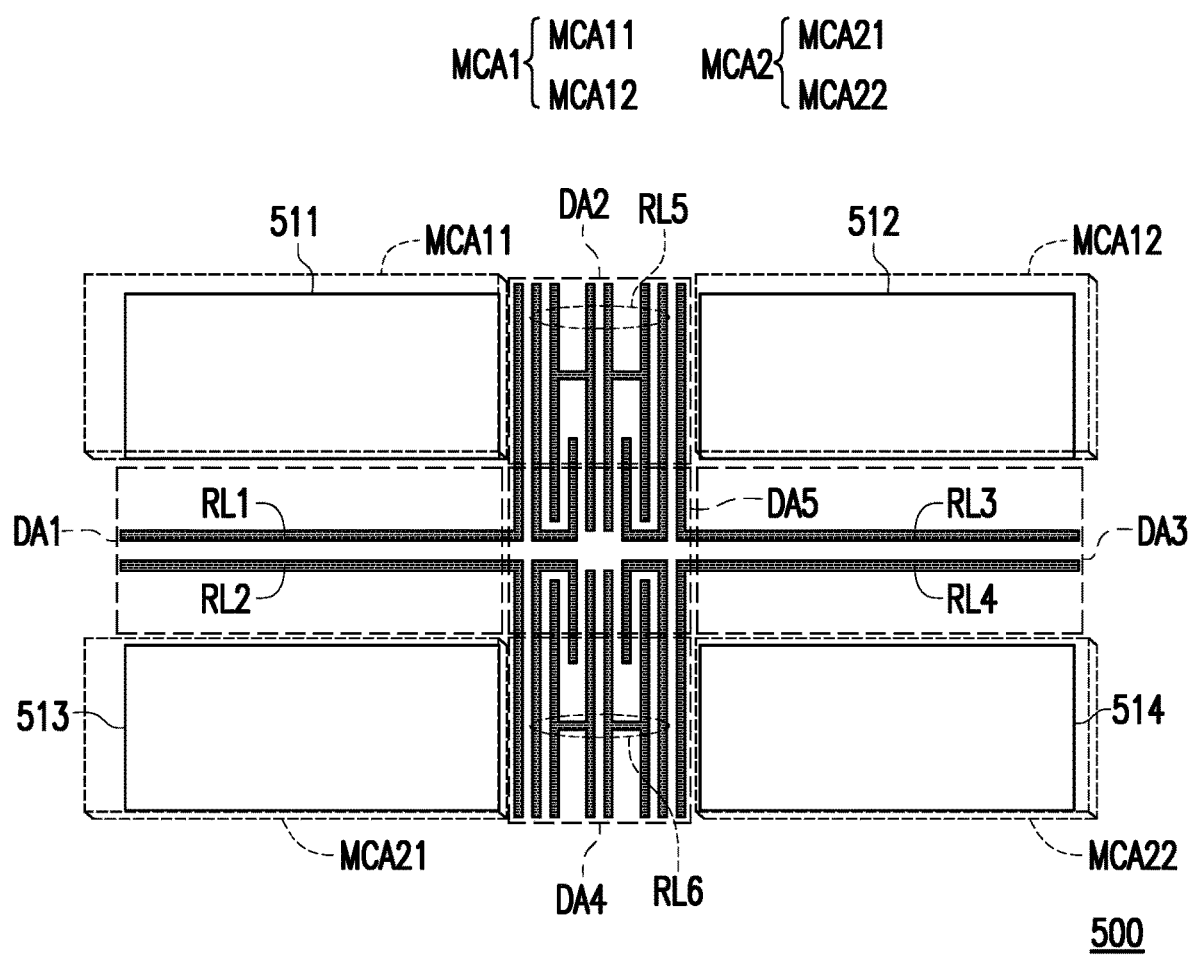
FIG. 5 is a schematic diagram of a memory device according to another embodiment of the invention.

Referring to FIG. 5, FIG. 5 is a schematic diagram of a memory device according to another embodiment of the invention. A memory device 500 includes a plurality of word line decoding circuit areas 511-514, a plurality of rails RL1-RL6, and a plurality of memory cell blocks MCA1-MCA2. In the embodiment, the word line decoding circuit areas 511-514 are arranged as an array, for example, a 2×2 array. The word line decoding circuit areas 511-514 form a plurality of isolation areas DA1-DA5, where the isolation area DA1 is formed between the adjacent word line decoding circuit areas 511 and 513; the isolation area DA2 is formed between the adjacent word line decoding circuit areas 511 and 512; the isolation area DA3 is formed between the adjacent word line decoding circuit areas 512 and 514; the isolation area DA4 is formed between the adjacent word line decoding circuit areas 513 and 514; and the isolation area DA5 is formed in the central area of the array.

The rails RL1-RL6 are disposed in the isolation areas DA1-DA5. In the embodiment, the rail RL1 is arranged along the isolation areas DA1, DA5 and DA2; the rail RL2 is arranged along the isolation areas DA1, DA5 and DA4; the rail RL3 is arranged along the isolation areas DA3, DA5 and DA2; the rail RL4 is arranged along the isolation areas DA3, DA5 and DA4; the rail RL5 is arranged in the isolation areas DA2 and DA5; the rail RL6 is arranged in the isolation areas DA4 and DA5. Each of the rails RL1-RL6 may be a common power rail or a common signal rail.

It should be noted that in the embodiment, the memory cell block MCA1 is divided into memory cell sub-blocks MCA11 and MCA12, and the memory cell block MCA2 is divided into memory cell sub-blocks MCA21 and MCA22. The memory cell sub-blocks MCA11 and MCA12 respectively cover the word line decoding circuit areas 511 and 512, and the memory cell sub-blocks MCA21 and MCA22 respectively cover the word line decoding circuit areas 513 and 514. Different from the aforementioned embodiments, the memory cell sub-blocks MCA11 and MCA12 do not cover the isolation area DA2 between the word line decoding circuit areas 511 and 512, and expose the isolation area DA2. The memory cell sub-blocks MCA21 and MCA22 do not cover the isolation area DA4 between the word line decoding circuit areas 513 and 514, and expose the isolation area DA4.

Similar to the embodiment of FIG. 1, the memory device 500 further includes a plurality of power drivers (not shown). The power drivers respectively correspond to the word line decoding circuit areas 511-514, and may be disposed between each of the word line decoding circuit areas 511-514 and the corresponding isolation areas DA1-DA4. In detail, the power driver corresponding to the word line decoding circuit area 511 may be disposed between the word line decoding circuit area 511 and the isolation area DA1; the power driver corresponding to the word line decoding circuit area 512 may be disposed between the word line decoding circuit area 512 and the isolation area DA1; the power driver corresponding to the word line decoding circuit area 513 may be disposed between the word line decoding circuit area 513 and the isolation area DA1; and the power driver corresponding to the word line decoding circuit area 514 may be disposed between the word line decoding circuit area 514 and the isolation area DA3. In this way, the rails RL1-RL4 serving as the common power rails may transmit the operating power and the reference ground power to the word line decoding circuit areas 511-514.

Similar to the embodiment of FIG. 1, the memory device 500 of the embodiment is a three-dimensional stacked memory device, and the memory cell blocks MCA1 and MCA2 may be three-dimensional stacked AND-type flash memory cell blocks or is NOR-type flash memory cell blocks.

Figure 6:
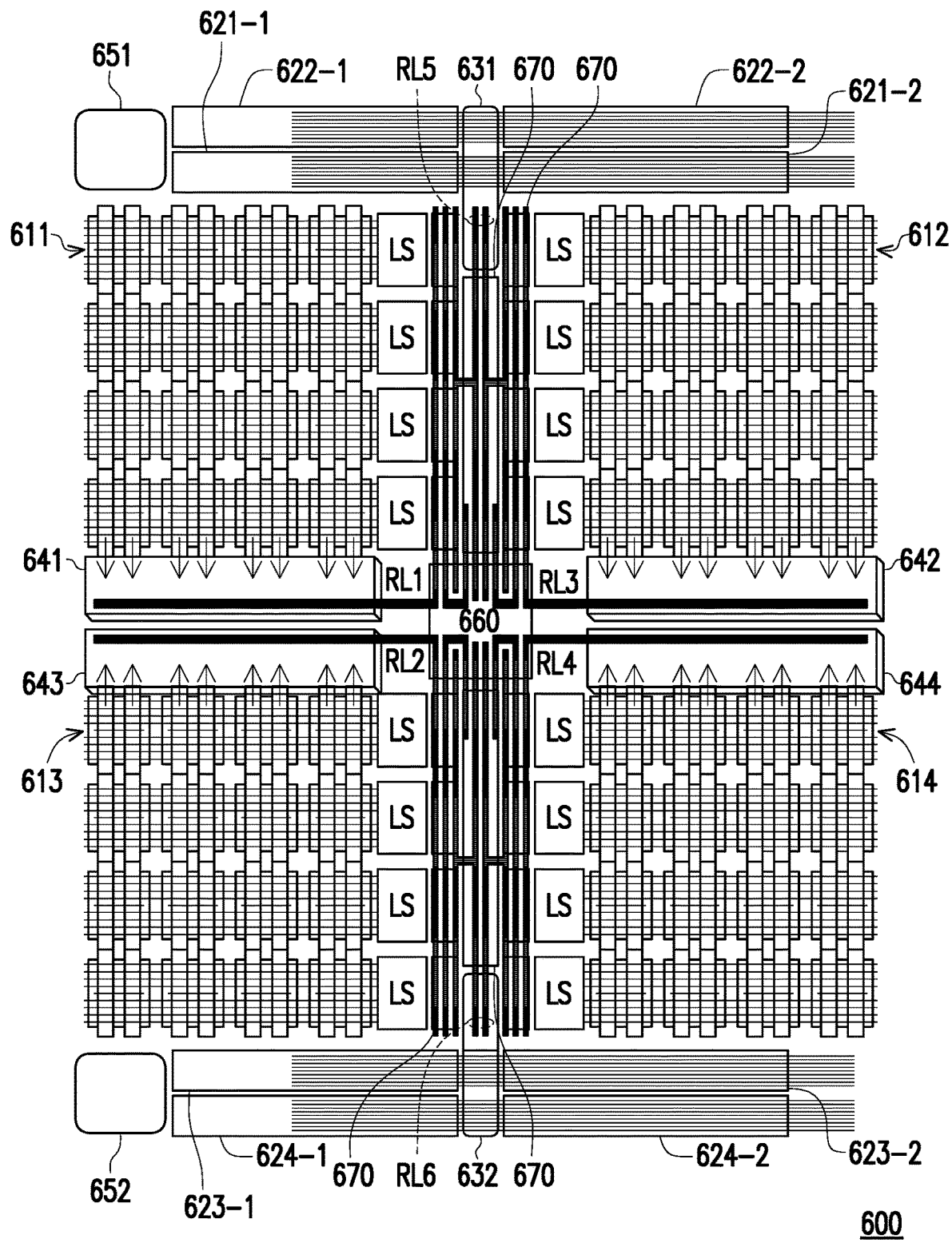
FIG. 6 is a structural top view of a memory device according to another embodiment of the invention.

Referring to FIG. 6, FIG. 6 is a structural top view of a memory device according to another embodiment of the invention. The description is made with reference of the schematic diagram of FIG. 5. A memory device 600 includes word line decoding circuit areas 611-614, a plurality of rails RL1-RL6, setting areas 621-1, 621-2, 623-1, 623-2 of bit line switches, setting areas 622-1, 622-2, 624-1, 624-2 of source line switches, power drivers 641-644, 651, 652, bit line switch and source line switch drivers 631, 632, a block decoder 660, and a plurality of auxiliary circuits 670 and a plurality of voltage shifter circuits LS.

The word line decoding circuit areas 611-614 are disposed in an array and form a plurality of isolation areas. The power drivers 641-644 are disposed in the array, where the power drivers 641-644 respectively correspond to the word line decoding circuit areas 611-614, and are respectively disposed adjacent to the word line decoding circuit areas 611-614. The rails RL1-RL6 are disposed the plurality of isolation areas in the array, and related positions thereof are the same as those in the embodiment of FIG. 5, and details thereof are not repeated.

In the embodiment, the power drivers 641-644 are respectively used to provide an operating power to the word line decoding circuit areas 611-614, and the power drivers 651 and 652 may be used to provide a reference ground power.

In addition, in the embodiment, the bit line switches respectively corresponding to the word line decoding circuit areas 611 and 612 may be set in different setting areas 621-1 and 621-2, and the source line switches respectively corresponding to the word line decoding circuit areas 611 and 612 may be set in different setting areas 622-1 and 622-2. The setting areas 621-1, 621-2 and 622-1, 622-2 may be disposed outside a first side edge (an upper side edge) of the array formed by the word line decoding circuit areas 611-614. The bit line switches respectively corresponding to the word line decoding circuit areas 613 and 614 may be set in different setting areas 623-1 and 623-2, and the source line switches respectively corresponding to the word line decoding circuit areas 613 and 614 may be set in different setting areas 624-1 and 624-2. The setting areas 623-1, 623-2 and 624-1, 624-2 may be disposed outside a second side edge (a lower side edge) of the array formed by the word line decoding circuit areas 611-614.

The bit line switch and source line switch driver 631 is disposed between the setting areas 621-1 and 622-1 and the setting areas 621-2 and 622-2. The bit line switch and source line switch driver 632 is disposed between the setting areas 623-1 and 624-1 and the setting areas 623-2 and 624-2. The bit line switch and source line switch drivers 631 and 632 are used to control an on/off state of the corresponding bit line switch and source line switch, thereby providing the corresponding memory cell block with the bit line signal and the source line signal.

It should be noted that in the embodiment, in the array formed by the word line decoding circuit areas 611-614, the block decoder 660, the plurality of auxiliary circuits 670 and the plurality of voltage shifter circuits LS may be disposed in the vertical isolation areas. The block decoder 660 may be disposed in the center of the array, and the auxiliary circuits 670 may be disposed above and below the block decoder 660. Each of the voltage shifter circuits LS may be disposed on a first side or a second side of each corresponding auxiliary circuit 670.

It should be noted that each of the rails RL1-RL4 may be a common power rail or a common signal rail. Each of the rails RL1-RL4 serving as the common power rail may transmit a common power to at least one of the power drivers 641-644, the block decoder 660, the auxiliary circuits 670 and the voltage shifter circuits LS. Each of the rails RL5, RL6 may be the common power rail or the common signal rail. Each of the rails RL1-RL4 may be used to transmit a common signal or a common power to at least one of the block decoder 660, the auxiliary circuits 670 and the voltage shifter circuits LS.

The common signal in the embodiment is similar to the common signal in the embodiment of FIG. 2, and detail thereof is not repeated.

In the embodiment, wiring paths of the rails RL1-RL6 do not conflict with wiring paths of the bit line switches and the source line switches in the setting regions 623-1, 623-2, 624-1, and 624-2. The rails RL1-RL6 may be simply and directly connected to the corresponding circuit components. Under the premise that the layout complexity is effectively reduced, the transmission impedance generated by the rails RL1-RL6 may be effectively reduced, thereby improving transmission performance of power and signals.

Figure 7:
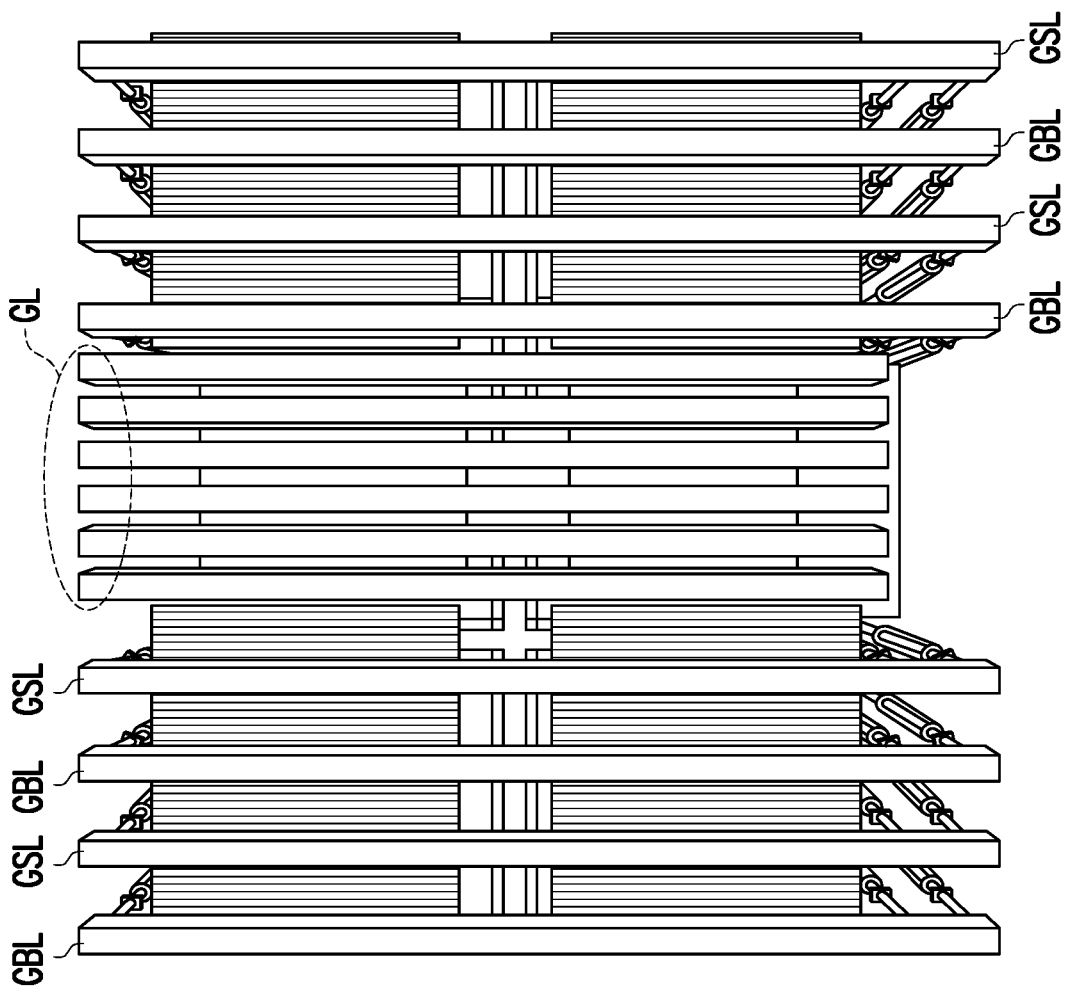
FIG. 7 is a structural schematic diagram of a memory device according to another embodiment of the invention.

Referring to FIG. 7, FIG. 7 is a structural schematic diagram of a memory device according to another embodiment of the invention. Referring to FIG. 6 at the same time, in FIG. 6, the rails RL1-RL6 disposed in the middle of the memory device 600 may be connected to a plurality of transmission lines GL through a plurality of transmission array vias. Where, the transmission lines GL may be formed by, for example, the second layer TM2 of the top metal layer. Moreover, the common bit line GBL and the common source line GSL of the memory device 600 may be formed through the second layer TM2 of the top metal layer and span over the memory cell blocks. Where, the common bit line GBL and the common source line GSL may be arranged in the interleaving manner. The common bit lines of the memory device 600 may have a same height with the transmission lines GL1 and GL2, and are formed on both sides of the transmission line GL.

Figure 8:
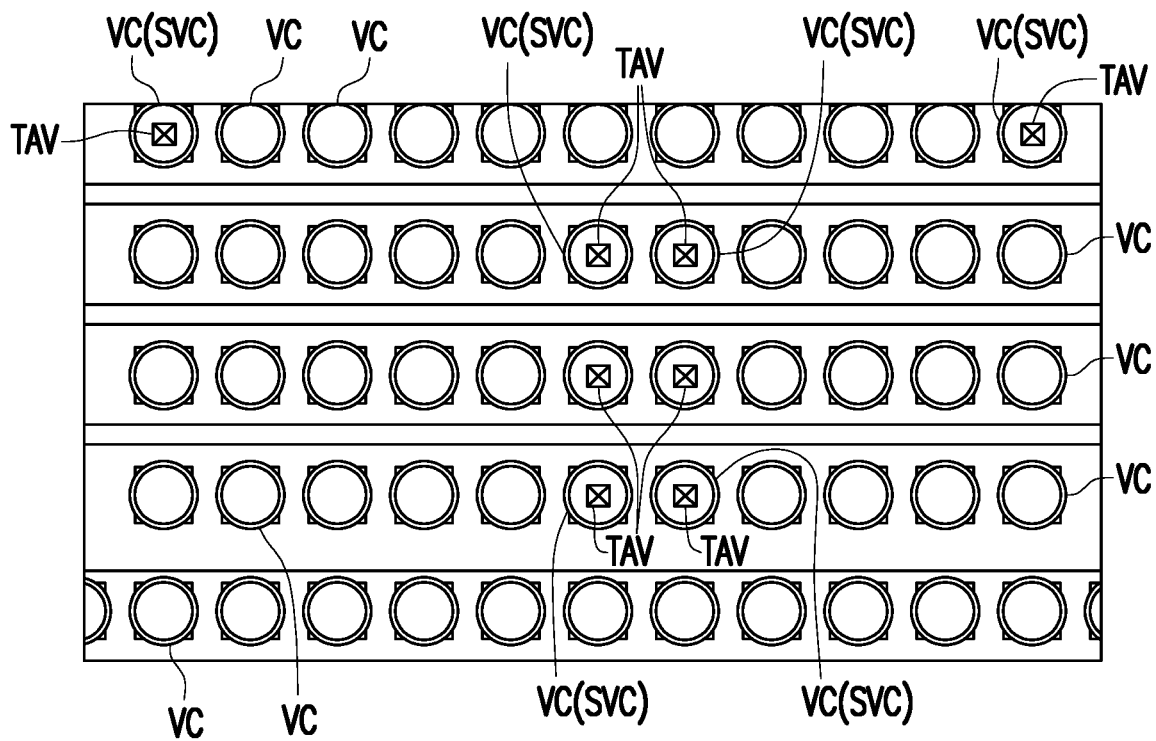
FIG. 8 is a schematic diagram illustrating an implementation of transmission array vias of the memory device of the embodiment of FIG. 7.

Referring to FIG. 8. FIG. 8 is a schematic diagram illustrating an implementation of the transmission array vias of the memory device of the embodiment of FIG. 7. In the memory device 600, a plurality of conductive vias VC may be first formed in the central isolation areas. The conductive vias VC may be, for example, arranged in a normal way. Further, a plurality of conductive vias VC may be selected, and the transmission array vias TAV may pass through these selected conductive vias VC. In an actual structure, these normal conductive vias VC may improve structural stability of the memory device 600.

In summary, in the memory device of the present invention, the word line decoding circuit areas are arranged in an array, and a plurality of isolation areas are formed therebetween. By arranging the common power rails and the common signal rails in the isolation areas, transmission wires of the common power and the common signal may not conflict with the wiring paths of the bit line switches and the source line switches, which may effectively reduce the wiring complexity of the memory device and improve its electrical characteristics.

What is claimed is:

1. A memory device, comprising:
a plurality of word line decoding circuit areas, arranged in an array, and forming a plurality of isolation areas, wherein each of the isolation areas is disposed between two adjacent word line decoding circuit areas;
a plurality of common power rails, wherein each of the common power rails is disposed along a plurality of the isolation areas; and
a plurality of power drivers, respectively corresponding to the word line decoding circuit areas, each of the power drivers being disposed between each of the power driving circuit areas and each of the corresponding isolation areas, wherein each of the power drivers is coupled to each of the corresponding common power rails, and is configured to provide a common power to the word line decoding circuit areas.

2. The memory device as claimed in claim 1, further comprising:
a first memory cell block, covering a first word line decoding circuit area, a second word line decoding circuit area, and a first isolation area between the first word line decoding circuit area and the second word line decoding circuit area; and
a second memory cell block, covering a third word line decoding circuit area, a fourth word line decoding circuit area, and a second isolation area between the third word line decoding circuit area and the fourth word line decoding circuit area,
wherein the first word line decoding circuit area and the second first word line decoding circuit area are arranged along a first direction, and the second word line decoding circuit area and the third word line decoding circuit area are arranged along a second direction, and the first direction is parallel to the second direction.

3. The memory device as claimed in claim 2, further comprising:
a plurality of first bit line switches, arranged in a first setting area located outside and adjacent to a first side edge of the array;
a plurality of first source line switches, wherein the first source line switches are arranged in a second setting area outside the first setting area;
a plurality of second bit line switches, arranged in a third setting area located outside and adjacent to a second side edge of the array, and the first side edge being opposite to the second side edge; and
a plurality of second source line switches, wherein the second source line switches are arranged in a fourth setting area outside the third setting area.

4. The memory device as claimed in claim 3, further comprising:
a first bit line switch and source line switch driver, disposed along the first side edge together with the first setting area, and transmitting a plurality of first driving signals to the first bit line switches and the first source line switches; and
a second bit line switch and source line switch driver, disposed along the second side edge together with the third setting area, and transmitting a plurality of second driving signals to the second bit line switches and the second source line switches.

5. The memory device as claimed in claim 1, wherein each of the common power rails is an L-shaped power rail.

6. The memory device as claimed in claim 1, further comprising:
a plurality of first transmission array vias, disposed on a first side of the array, and electrically coupled to a part of the common power rails; and
a plurality of second transmission array vias, disposed on a second side of the array, and electrically coupled to another part of the common power rails.

7. The memory device as claimed in claim 1, further comprising:
a first memory cell block, divided into a first memory cell sub-block and a second memory cell sub-block, the first memory cell sub-block and the second memory cell sub-block covering a first word line decoding circuit area and a second word line decoding circuit area, and the first memory cell sub-block and the second memory cell sub-block exposing a first isolation area between the first word line decoding circuit area and the second word line decoding circuit area; and
a second memory cell block, divided into a third memory cell sub-block and a fourth memory cell sub-block, the third memory cell sub-block and the fourth memory cell sub-block covering a third word line decoding circuit area and a fourth word line decoding circuit area, and the third memory cell sub-block and the fourth memory cell sub-block exposing a second isolation area between the third word line decoding circuit area and the fourth word line decoding circuit area.

8. The memory device as claimed in claim 7, further comprising:
a plurality of first bit line switches and a plurality of first source line switches, disposed adjacent to the first memory cell sub-block;
a plurality of second bit line switches and a plurality of second source line switches, disposed adjacent to the second memory cell sub-block;
a plurality of third bit line switches and a plurality of third source line switches, disposed adjacent to the third memory cell sub-block; and
a plurality of fourth bit line switches and a plurality of fourth source line switches, disposed adjacent to the fourth memory cell sub-block.

9. The memory device as claimed in claim 8, further comprising:
a first bit line switch driver, disposed between the first bit line switches and the second bit line switches;
a first source line switch driver, disposed between the first source line switches and the second source line switches;
a second bit line switch driver, disposed between the third bit line switches and the fourth bit line switches; and
a second source line switch driver, disposed between the third source line switches and the fourth source line switches.

10. The memory device as claimed in claim 7, further comprising:
a plurality of first transmission array vias, disposed in the first isolation area, and electrically coupled to a part of the common power rails; and
a plurality of second transmission array vias, disposed in the second isolation area and electrically coupled to another part of the common power rails.

11. The memory device as claimed in claim 7, further comprising:
a plurality of common signal rails, disposed in the isolation areas.

12. The memory device as claimed in claim 1, further comprising:
a block decoder, disposed at a center of the array;
a plurality of auxiliary circuits, each of the auxiliary circuits being disposed in each of the isolation areas of two of the adjacent word line decoding circuit areas; and
a plurality of voltage shifter circuits, wherein each of the voltage shifter circuits is arranged on a side edge of each of the auxiliary circuits.

13. The memory device as claimed in claim 1, wherein each of the word line decoding circuit areas comprises a plurality of word line decoding circuits for respectively generating a plurality of word line signals.

14. The memory device as claimed in claim 13, wherein each of the common power rails provides an operating voltage or a reference ground voltage to each of the word line decoding circuits.

* * * * *